(12) United States Patent
Hur (10) Patent No.: US 7,821,855 B2
(45) Date of Patent: Oct. 26, 2010

(54) MULTI-PORT MEMORY DEVICE

(75) Inventor: Hwang Hur, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 574 days.

(21) Appl. No.: 11/647,407

(22) Filed: Dec. 29, 2006

(65) Prior Publication Data

US 2008/0077746 A1    Mar. 27, 2008

(30) Foreign Application Priority Data

Sep. 21, 2006    (KR)    ...................... 10-2006-0091631

(51) Int. Cl.
  G11C 29/00    (2006.01)
  G11C 7/10     (2006.01)
  G11C 8/16     (2006.01)
(52) U.S. Cl. ............. 365/201; 365/230.05; 365/230.03; 365/189.05; 365/189.03
(58) Field of Classification Search ............ 365/230.03, 365/200, 201, 230.05, 189.05, 189.17, 189.03
  See application file for complete search history.

(56) References Cited

U.S. PATENT DOCUMENTS 6,259,628 B1 * 7/2001 Park ...................... 365/185.22

2005/0251713 A1 * 11/2005 Lee ............................. 714/718
2005/0273670 A1 * 12/2005 Park ............................ 714/43
2007/0073981 A1    3/2007 Im et al.

FOREIGN PATENT DOCUMENTS

JP    2000-172524    6/2000

OTHER PUBLICATIONS

Korean Office Action, with English translation, issued in Korean Patent Application No. KR 10-2006-0091631, mailed Jul. 29, 2008.

* cited by examiner

Primary Examiner—J. H. Hur
(74) Attorney, Agent, or Firm—IP & T Group LLP (57) ABSTRACT

A multi-port memory device includes: a bank having a plurality of matrices; a plurality of test data input/output units where data is input/output using a test mode for detecting a defective memory cell; a plurality of ports converted into a decoding device for decoding a command/address at the test mode; a plurality of data transfer lines for transferring data between the matrices and the test data I/O units, wherein the data transfer lines is grouped into the number of matrices; and a plurality of temporary storing units included between the data transfer lines and the matrices for temporarily storing data.

8 Claims, 6 Drawing Sheets

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|---|---|---|---|---|---|---|---|---|---|
| PHY | | CMD | | FRAME PAYLOAD | | | | | | | | | | | | | | | |

FIG. 3B
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|---|---|---|---|---|---|---|---|---|---|
| PHY | | CMD | ACT | WT | PCG | UDM | | | | BANK | | | | COLUMN ADDRESS | | | | | |
| 1 | 1 | 1 | 0 | 0 | PCG | 4th | 3rd | 2nd | 1st | 3 | 2 | 1 | 0 | 5 | 4 | 3 | 2 | 1 | 0 |

FIG. 3C
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|---|---|---|---|---|---|---|---|---|---|
| PHY | | CMD | LDM | UPPER BYTE | | | | | | | | LOWER BYTE | | | | | | | |
| 1 | 0 | '0' | LDM | 7 | 6 | 5 | 4 | 3 | 2 | 1 | 0 | 7 | 6 | 5 | 4 | 3 | 2 | 1 | 0 |

FIG. 3D
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|---|---|---|---|---|---|---|---|---|---|
| PHY | | CMD | ACT | WT | PCG | RD | ESC | ABNK | RFU | BANK | | | | COLUMN ADDRESS | | | | | |
| 1 | 0 | '1' | '0' | '0' | PCG | '1' | '0' | ABNK | '0' | 3 | 2 | 1 | 0 | 5 | 4 | 3 | 2 | 1 | 0 |

FIG. 3E
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|---|---|---|---|---|---|---|---|---|---|
| PHY | | ID | | UPPER BYTE | | | | | | | | LOWER BYTE | | | | | | | |
| 1 | 0 | '1' | '0' | 7 | 6 | 5 | 4 | 3 | 2 | 1 | 0 | 7 | 6 | 5 | 4 | 3 | 2 | 1 | 0 |

FIG. 3F
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|---|---|---|---|---|---|---|---|---|---|
| PHY | | CMD | ACT | COMMAND INFOMATION | | | | | | | | | | | | | | | |
| 1 | 0 | '1' | ACT | 15 | 14 | 13 | 12 | 11 | 10 | 9 | 8 | 7 | 6 | 5 | 4 | 3 | 2 | 1 | 0 |

MULTI-PORT MEMORY DEVICE

CROSS-REFERENCE TO RELATED APPLICATIONS

The present invention claims priority of Korean patent application number 10-2006-0091631, filed on Sep. 21, 2006, which is incorporated by reference in its entirety.

BACKGROUND OF THE INVENTION

The present invention relates to a semiconductor design technology, and more particularly, to a multi-port memory device for detecting a defect of a memory cell.

Recently, the application range for a dynamic random access memory (DRAM) has been expanded from conventional devices such as desktop computers, laptop computers and servers to audio/video devices such as high definition television (HDTV). Accordingly, it is required that conventional way of data input/output of the DRAM be modified to a new way of data input/output. Herein, the conventional way of data input/output means a parallel input/output interface where a data exchange is performed through a single port which includes a plurality of input/output pins.

Figure 1:
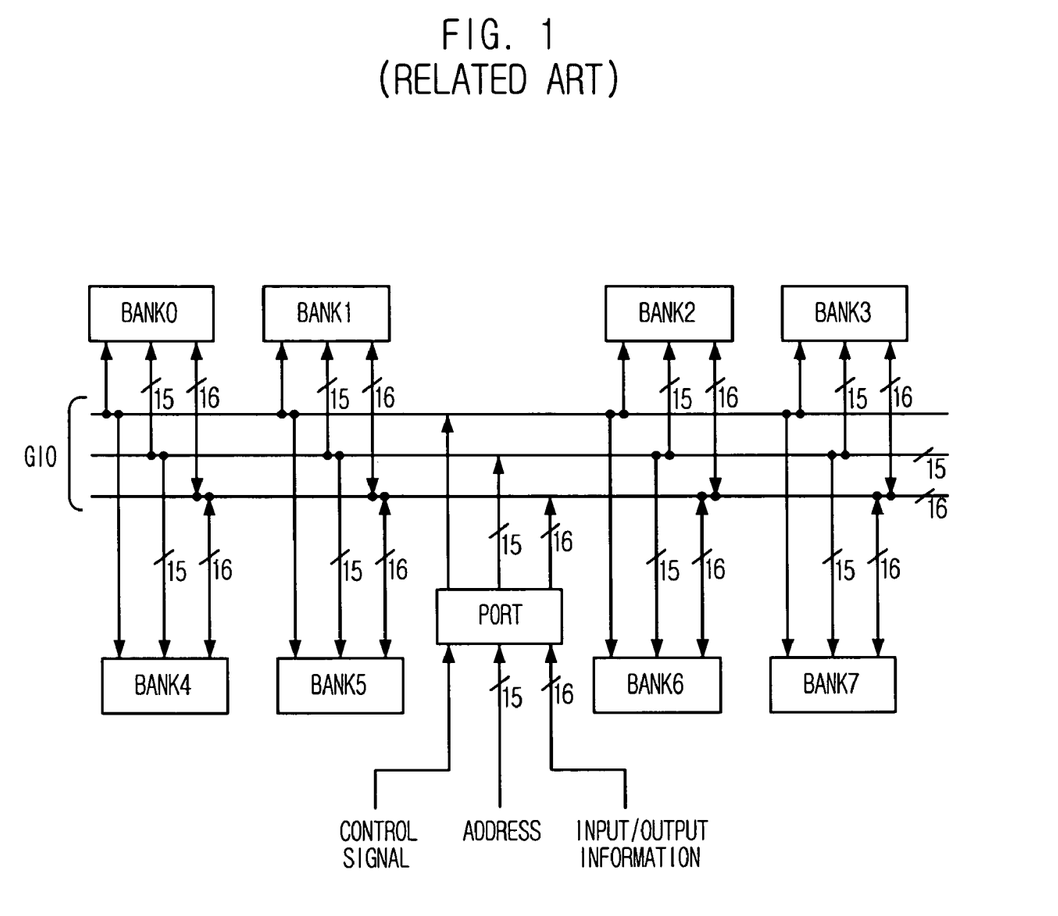
FIG. 1 is a block diagram showing a conventional single-port memory device.

FIG. 1 is a block diagram showing a conventional single-port memory device. In this particular example, the conventional single-port memory device is an x16, 512M DRAM which includes 8 banks.

The conventional single-port memory device includes first to an eighth banks BANK0 to BANK7, a port (PORT), and a plurality of communication lines (GIO).

Each of the first to the eighth banks BANK0 to BANK7 includes an n×m number of memory cells arranged in a matrix form. The port performs individual communication with the first to the eighth banks BANK0 to BANK7. The plurality of communication lines provides for a signal transfer between the port and a pin, and between the port and first to the eighth banks BANK0 to BANK7.

Herein, the communication lines are global I/O lines generally included in the DRAM including a control bus, 15 lines of address bus and 16 lines of information bus.

With conventional single-port memory devices, since a single-port is used, it is difficult to embody various multimedia functions. For embodying such multimedia functions using single-port memory devices, plural numbers of memory devices, e.g., DRAMs, should be independently constituted so that each DRAM performs a different function. However, in case of independently operating DRAMs, it is difficult to appropriately allocate memory among a plurality of devices which have different amounts of memory access. Therefore, memory usage efficiency is decreased compared with using a single memory device.

For solving the above-mentioned problem, the applicant of the present invention proposed a multi-port memory device having a serial input/output interface as disclosed in a commonly owned copending application, U.S. Ser. No. 11/528,970, filed on Sep. 27, 2006, entitled "MULTI-PORT MEMORY DEVICE WITH SERIAL INPUT/OUTPUT INTERFACE".

Figure 2:
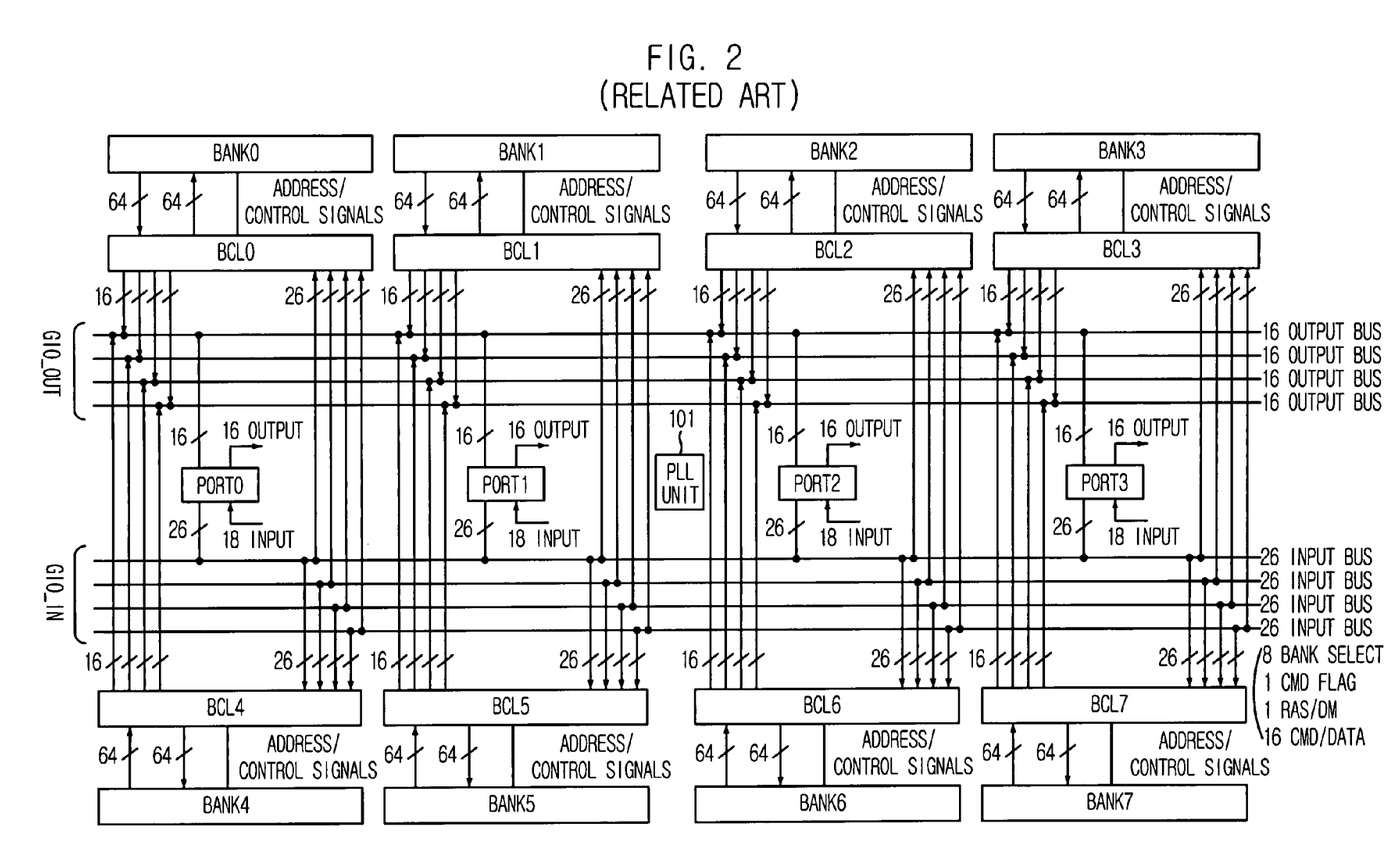
FIG. 2 is a block diagram showing a conventional multi-port memory device.

FIG. 2 is a block diagram showing a conventional multi-port memory device.

In the illustrated example, the multi-port memory device includes 4 ports, i.e., PORT0 to PORT3, 8 banks, i.e., BANK0 to BANK7, has a 16-bit data frame, and performs a 64-bit prefetch operation.

Referring to FIG. 2, the multi-port memory device includes a first to a fourth ports PORT0 to PORT3 for independently performing a serial communication with different external devices; first to eighth banks BANK0 to BANK7 located in rows at an upper part and a lower part from the first to the fourth ports PORT0 to PORT 3 (upper part: BANK0 to BANK3, lower part: BANK4 to BANK7); global output lines GIO_OUT located in a row between the first to the fourth ports PORT0 to PORT3 and the first to the fourth banks BANK0 to BANK3 for performing parallel information transfer; global input lines GIO_IN arranged in a row between the first to the fourth ports PORT0 to PORT3 and the fifth to the eighth banks BANK4 to BANK7 for performing parallel information transfer; first to an eighth bank control units BCL0 to BCL7 for controlling data and a signal transfers between the global input/output lines and first to the eighth banks BANK0 to BANK7; and a PLL unit located between the second port PORT1 and the third port PORT2 for clocking internal commands and data input to first to fourth ports PORT0 to PORT3.

The multi-port memory device includes a plurality of ports, and independent operations can be performed at each port. Therefore, the multi-port memory device can be used as a memory of a digital device which requires high speed data processing.

Further, through data received from the first to the fourth ports PORT0 to PORT3, an address and an internal command are generated. For distinguishing the address and the internal command from data, a predetermined protocol (data frame) is generally used.

FIGS. 3A to 3F are diagrams depicting a data frame of the multi-port memory device.

Figure 3A:
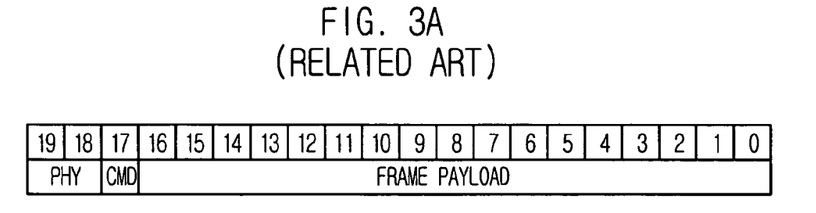
FIGS. 3A to 3F are diagrams depicting data frames of the multi-port memory device shown in FIG. 2.
Figure 3B:
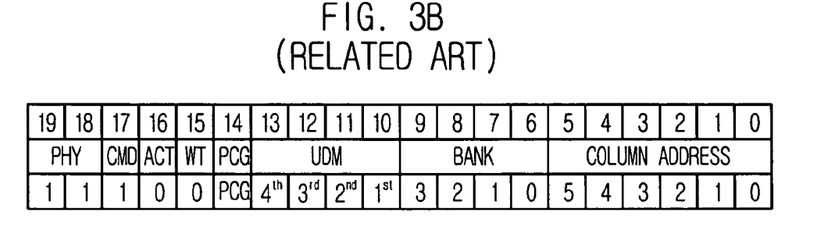
Figure 3C:
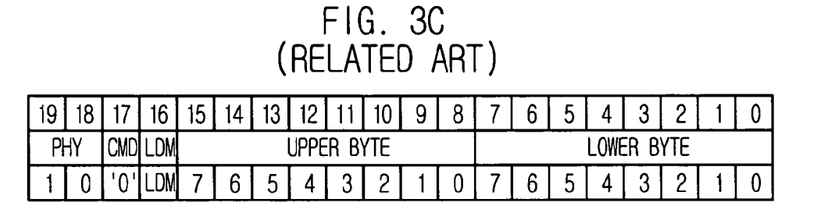
Figure 3D:
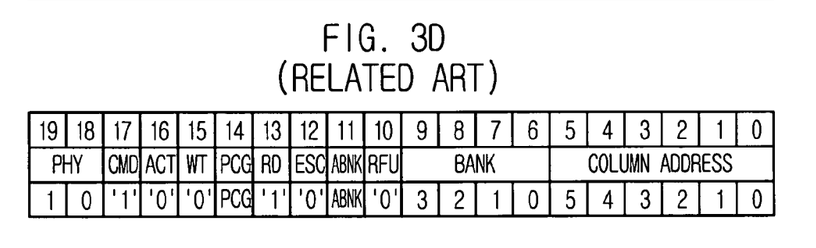
Figure 3E:
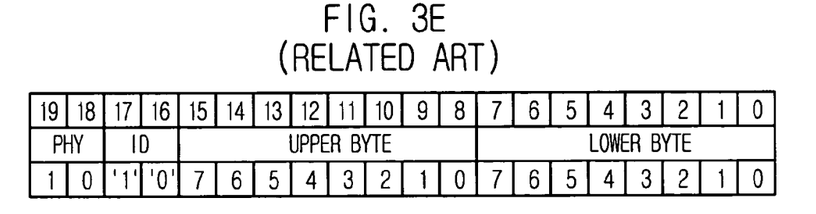
Figure 3F:
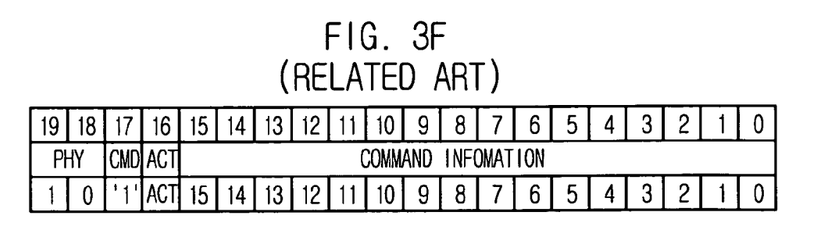

In detail, FIG. 3A depicts a basic frame; FIG. 3B depicts a write command frame; FIG. 3C depicts a write data frame; FIG. 3D depicts a read command frame; FIG. 3E depicts a read data frame; and FIG. 3F depicts a command frame.

Referring to FIG. 3B, the 19th and the 18th bits are physical link coding (PHY) bits which are not substantially used; the 17th bit is a command (CMD) bit; and the 16th to the 14th bits are active command (ACT), write command (WT) and precharge command (PCG) bits respectively. For input of a normal write command, the 17th to 15th bits and the 14th bits should be '1', '0', '1' and '0' respectively; and for input of a precharge command and write command, the 17th to 15th bits and the 14th bits should be '1', '0', '1' and '1' respectively.

Meanwhile, the 13th to the 10th bits are upper byte write data mask (UDM) for controlling a transfer of an upper byte of the write data frame; the 9th to 6th bits are bank information (BANK) to be written; and the 5th the 0th bits represent a column address.

Next, referring to FIG. 3C, the 19th and the 18th bits are physical link coding (PHY) bits which are not substantially used; the 17th bit is a command (CMD) bit; a 16th bit is a lower byte write data mask (LDM) for controlling a transfer of a lower byte of the write data; the 15th the 8th bits are the upper byte of the write data; and the 7th to the 0th bits are the lower byte of the write data. For an input of a normal write data, the 17th bit, i.e., the CMD bit, should be '0'.

Next, referring to the frame FIG. 3D, the 19th and the 18th bits are physical link coding (PHY) bits which are not substantially used; the 17th bit is a command (CMD) bit; the 16th to the 13th bits are active command (ACT), write command (WT), precharge command (PCG) and read command (RD) bits respectively.

For input of a normal read command, the 17th to the 13th bits should be '1', '0', '0', '0' and '1' respectively; and for a write operation accompanied with a precharge operation, the 17th to the 13th bits should be '1', '0', '0', '1' and '1' respectively.

Meanwhile, the 12th bit is a command extension (ESC (escape)) bit. For instance, when the command bit is '1' and the precharge command bit is '1' and the read command bit is '1' for an all-banks precharge operation, the command extension bit serves to input a command of the all-banks precharge operation. That is, since there is no bit for representing the all-banks precharge operation, the all-banks precharge operation and an auto refresh operation are performed by using the command extension bit and the existing command bits.

Further, the 11th bit is a bank activation (ABNK(active bank)) bit which is set during setting of the read command bit; the 9th to the 6th bits are bank information (BANK) to be written; and the 5th to the 0th bits represent a column address.

Next, referring to FIG. 3E, the 19th and the 18th bits are physical link coding (PHY) bits which are not substantially used; the 15th to the 8th bits are upper byte of a read data; and the 7th to the 0th bits are lower byte of the read data. For input of a normal read data, the 17th bit, i.e., the command bit, should be '0'.

The multi-port memory device has a serial input/output interface using the above-mentioned protocol (data frame). Since the multi-port memory device has a plurality of ports, plural operations can be performed simultaneously. For instance, while a write operation is performed at the first port PORT0, a read operation can be performed at the second port PORT1. In this manner, a large quantity of data can be processed at high speed. Therefore, the multi-port memory device can be employed in a device which processes a large quantity of audio/video data, e.g., a digital television.

Meanwhile, for testing the multi-port memory device, tests should be performed through the ports (PORT0 to PORT3), which have a high speed serial input/output interface. However, in the case of testing, a DRAM test equipment does not support the high speed serial input/output interface at the ports, or the test method cannot be used when there is an error of an logic element included in the ports.

For overcoming the above-mentioned problem, a new structure should be provided so that the testing can be performed independent of the ports and can be supported by DRAM test equipment.

In addition, since the multi-port memory device has a complicated structure including the plurality of ports and the plurality of bank control units, a defective part cannot be easily detected. Under this condition, it is difficult to find a defection of memory cells which have a highest ratio of defective.

SUMMARY OF THE INVENTION

Embodiments of the present invention are directed at providing a multi-port memory device that enables easily detecting a defective memory cell and for particularizing a data transfer line between a data input/output device and a memory cell in order to test a memory cell.

In accordance with an aspect of the present invention, there is provided a multi-port memory device, including: a bank having a plurality of matrices; a plurality of test data input/output units where data is input/output at a test mode for detecting a defective memory cell; a plurality of ports converted into a decoding device for decoding a command/address at the test mode; a plurality of data transfer lines for transferring data between the matrix and the test data I/O units, wherein the data transfer lines are grouped into the number of matrices; and a plurality of temporary storing units included between the data transfer lines and the matrices for temporarily storing data.

In accordance with another aspect of the present invention, there is provided a test method for a multi-port memory device, including: transferring data from a particular test data input/output unit to a particular memory cell according to a write operation of a test mode for detecting a defect of a memory cell; transferring data from the particular memory cell to the particular test data input/output unit according to a read operation of the test mode; and detecting a defect in the data.

DESCRIPTION OF SPECIFIC EMBODIMENTS

It is an object of the present invention to provide a multi-port memory device having a test data input/output unit where a data is input or output in a test mode for particularizing a data transfer between first to fourth test data I/O units DQ0 to DQ3 and a memory cell in order to detect a defective memory cell. Accordingly, a defective memory cell can be easily and efficiently detected.

Hereinafter, a semiconductor memory device in accordance with the present invention will be described in detail referring to the accompanying drawings.

Figure 4:
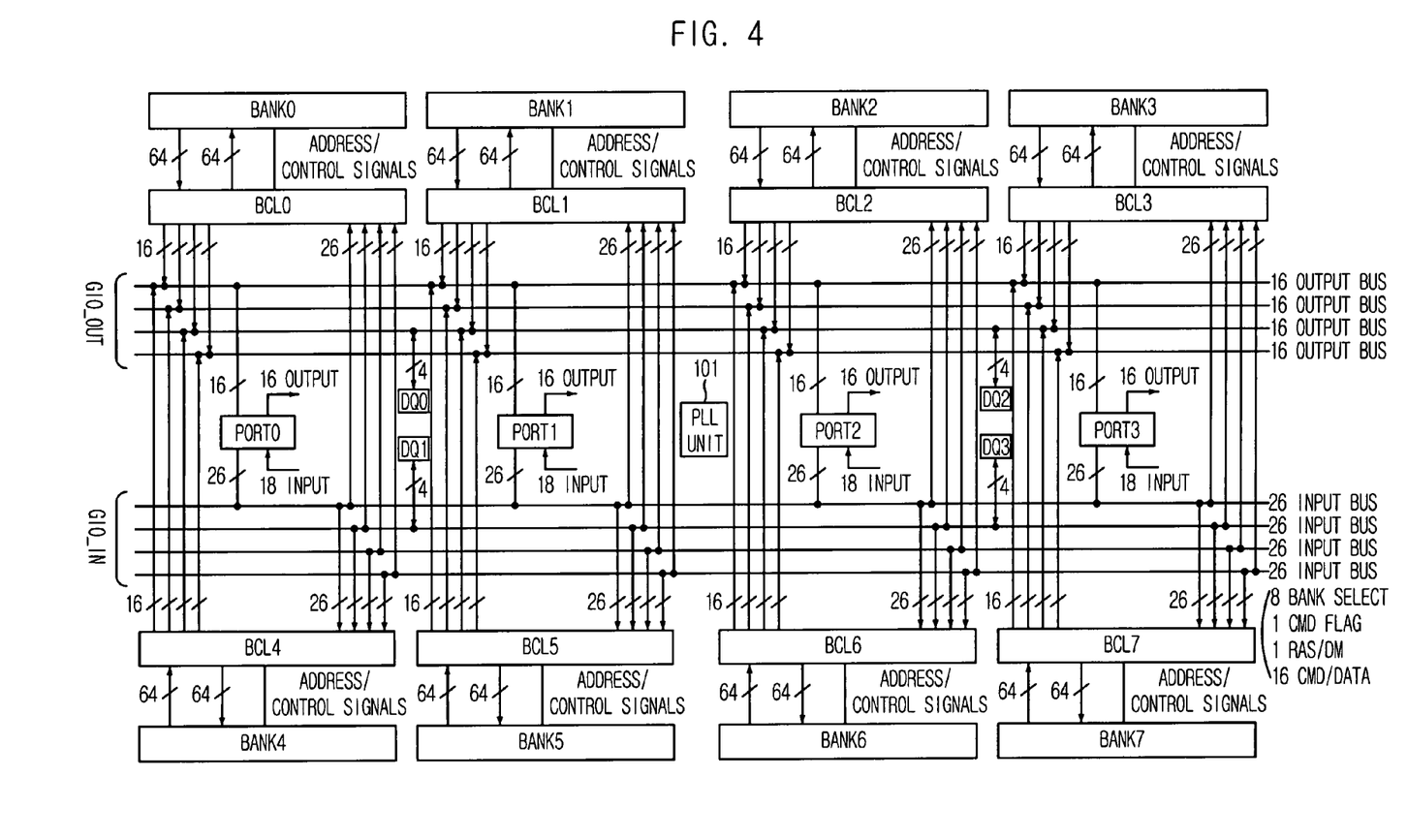
FIG. 4 is a block diagram showing a multi-port memory device provided with a test pad in accordance with a preferred embodiment of the present invention.

FIG. 4 is a block diagram showing a multi-port memory device provided with a test pad in accordance with a preferred embodiment of the present invention.

As shown, the multi-port memory device includes first to a fourth ports PORT0 to PORT3; first to an eighth banks BANK0 to BANK7; first to an eighth bank control units BCL0 to BCL7; PLL unit 101; global output lines GIO_OUT, global input lines GIO_IN; and first to fourth test data input/output (I/O) units DQ0 to DQ3 connected to the global input and output lines GIO_IN and GIO_OUT. Since the first to the fourth ports PORT0 to PORT3, the first to the eighth banks BANK0 to BANK7, the first to the eighth bank control units BCL0 to BCL7, the PLL unit 101, the global output line GIO_OUT and the global input line GIO_IN are same as those of in the above-mentioned conventional multi-port memory device, detailed descriptions of these units are omitted.

The first to fourth test data I/O units DQ0 to DQ3 are included in order to detect defective memory cells. Data are input or output through the first to fourth test data I/O units DQ0 to DQ3 without regard to the first to the fourth ports PORT0 to PORT3 where data are input or output when the multi-port memory device is normally operated.

That is, when the multi-port memory device enters a DRAM cell test mode (DTM), input/output (I/O) pins of the first to the fourth ports PORT0 to PORT3 are converted to command/address decoding pins and data input/outputs are performed through the first to fourth test data I/O units DQ0 to DQ3.

Further, the first to fourth test data I/O units DQ0 to DQ3 are connected to 16 particular lines among the global input and output lines GIO_IN and GIO_OUT and access the memory cell through the 16 particular lines.

Meanwhile, an operation of the multi-port memory device at a normal mode is described below.

To begin with, a write operation is performed on a 64-bit basis. For a write operation, data externally transferred in series is parallelized at the port to be transferred to the global input lines GIO_IN.

At this time, 64-bit data is divided on a 16-bit basis to be sequentially transferred to a target bank control unit over 4 clock periods. Then, the data sequentially transferred to the target bank control unit is transferred to a bank in a single operation after all the data is gathered to the bank control unit. The bank has a small page size for writing/reading a large quantity of data at high speed by using a serial input/output method.

In detail, since an independent read/write operation can be performed through each port, it is possible that two banks are active at the same time. In this case, an error may occur due to power consumption such as an internal power drop. Therefore, the number of bit lines enabled by one word line is small. That is, an individual bank (one of the first to the eighth banks BANK0 to BANK7) is divided into 4 quarters composed of 4 matrices. Herein, the page size can be substantially 4 k bits.

Continuously, a read operation is performed in reverse order as compared to a write operation. That is, a 64-bit data is output at once from a bank to be temporarily stored in a bank control unit. Then, the data is transferred to a port in 16 bits during 4 clocks and is serialized for external transfer.

The above-mentioned read/write operation of the multi-port memory device is synchronized with a command clock TCLK, which is used for clocking a command/address signal, and a data transfer clock DCLK, which is used for a data read/write operation. There are two modes, i.e., a QDR mode and a DDR mode, according to the frequencies of the command clock TCLK and the data transfer clock DCLK under a condition where the command clock TCLK and the data transfer clock DCLK have a synchronized rising edge. In the QDR mode, the frequency of the data transfer clock DCLK is double that of the command clock TCLK; at the DDR mode, the data transfer clock DCLK and the command clock TCLK have the same frequency. The two modes can be set by a mode register set (MRS) upon entering a DTM mode.

Figure 5:
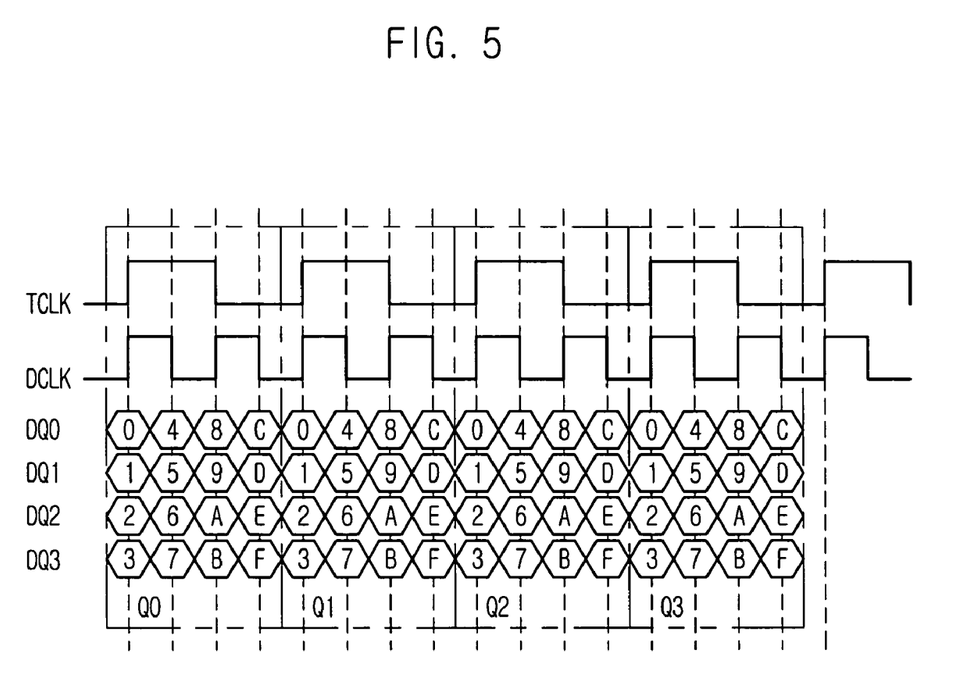
FIG. 5 is a diagram depicting an operation of a QDR mode of the multi-port memory device shown in FIG. 4.

FIG. 5 is a diagram depicting the QDR mode.

The figure illustrates where the frequency of the data transfer clock DCLK is double that of the command clock TCLK, and the data transfer clock DCLK and the command clock TCLK have a synchronized rising edge. Further, it is shown that data (depicted as hexadecimal numbers) is input to a quarter (Q0 to Q3) of a bank in synchronization with every rising and falling edge of the data transfer clock DCLK. The data (depicted as hexadecimal numbers) are input through corresponding test data I/O units.

In DTM mode, when data is input/output in synchronization with every rising and falling edge of the data transfer clock DCLK on the basis of the QDR mode, a data mapping is performed for designating a matrix address of a column path according to an order of each data (an order of transferring 16-bit data over 4 clocks). For this, the multi-port memory device includes data transfer lines for directly connecting the global input/output lines GIO_IN and GIO_OUT to the first to the eighth banks BANK0 to BANK7.

Figure 6:
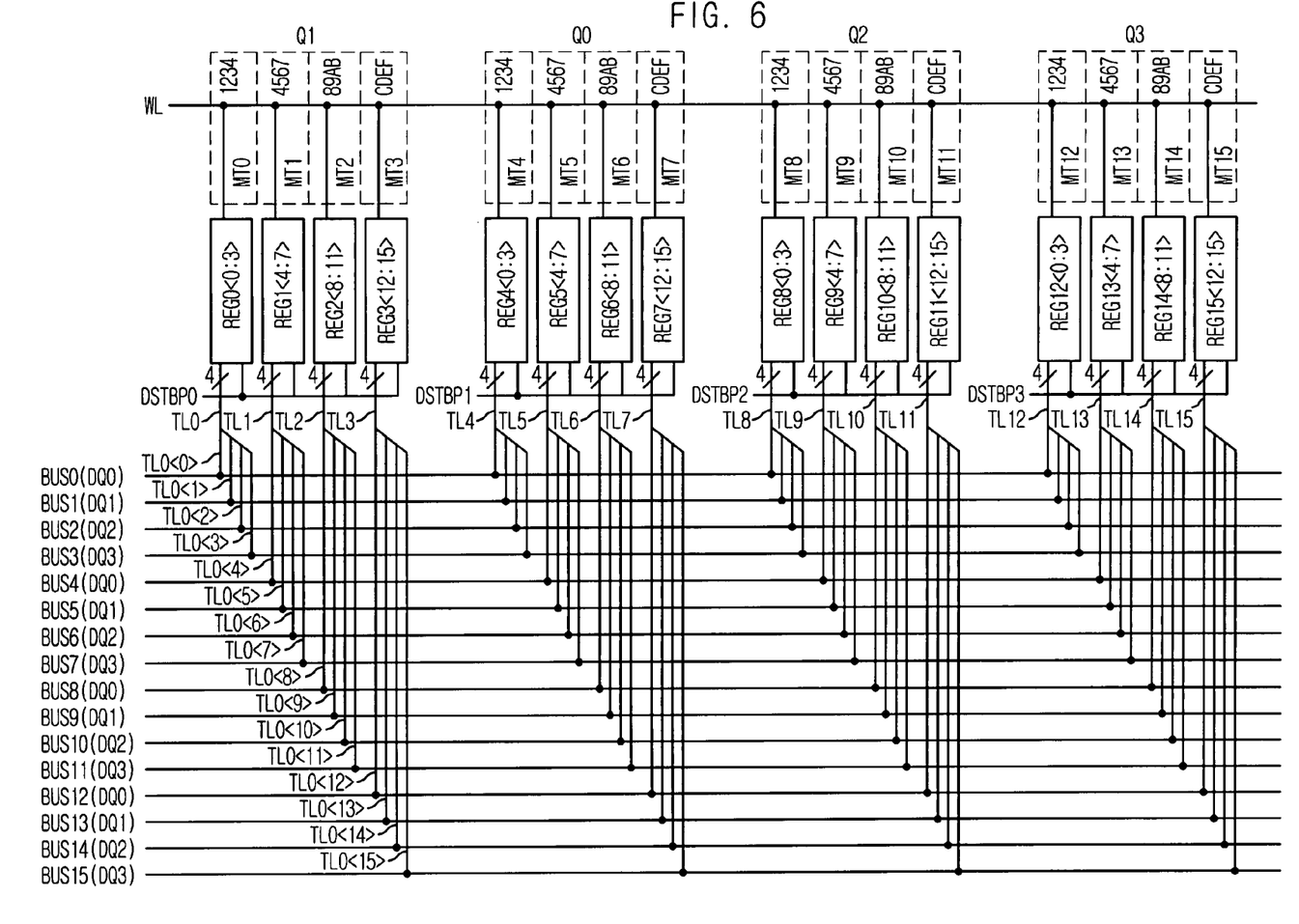
FIG. 6 is a block diagram illustrating a global/bank connection line included in the multi-port memory device shown in FIG. 4.

FIG. 6 is a block diagram illustrating a global/bank connection line included in the multi-port memory device.

Referring to FIG. 6, global/bank connection lines TL are included in the bank control unit (BCL0 to BCL7) and are individually connected to each line (BUS0 to BUS15) of the global input/output lines GIO_IN and GIO_OUT, each of which has 16 lines. Lines of the global/bank connection line TL are divided into 4 groups, each of which has 4 lines so that each group of 4 lines is connected to one matrix (one of MT0 to MT15) of one quarter (one of Q0 to Q3). Temporary data storing units (REG0 to REG15) are included for temporarily storing data between the matrices (MT0 to MT15) and the global/bank connection lines TL.

When the multi-port memory device is in a normal operation, data is transferred from a port to a selected target bank. That is, data input through a port is transferred via global input lines GIO_IN and are decoded in a bank control unit to be transferred to the target bank. The decoded data is transferred through the global/bank connection lines TL.

When the multi-port memory device enters DTM mode, data is loaded on the global input lines GIO_IN through the first to fourth test data I/O units DQ0 to DQ3, which are provided with data parallelization/serialization devices. Then, data is stored into the data temporary storing unit through the global/bank connection lines TL, which are individually connected to global input lines GIO_IN. That is, a process of transferring the data loaded on the global input lines GIO_IN through the first to fourth test data I/O units DQ0 to DQ3 to quarter banks Q0 to Q3 is particularized through the global/bank connection lines TL.

In detail, first to fourth test data I/O units DQ0 to DQ3 split externally input data into 16-bit pieces in order to sequentially input the data via global input lines GIO_IN.

A first 16-bit piece of data is transferred to 4 matrices (MT0 to MT3) associated with a first quarter bank Q0; a second 16-bit piece of data is transferred to 4 matrices (MT4 to MT7) associated with a second quarter bank Q1; a third 16-bit piece of data is transferred to 4 matrices (MT8 to MT11) associated with a third quarter bank Q2; and a fourth 16-bit piece of data is transferred to 4 matrices (MT12 to MT15) associated with a fourth quarter bank Q3.

Further, for explaining the above-mentioned particularization, i.e., the process of transferring the data loaded on the global input lines GIO_IN through the first to fourth test data I/O units DQ0 to DQ3 to quarter banks Q0 to Q3 is particularized through the global/bank connection lines TL, data output from the first test data I/O unit DQ0 is particularly transferred to first, a fifth, a ninth and a thirteenth lines BUS0, BUS4, BUS8, BUS12 among the global input lines GIO_IN.

In another instance, data output from the second test data I/O unit DQ1 is particularly transferred to second, a sixth, a tenth and a fourteenth lines BUS1, BUS5, BUS11, BUS15 among the global input lines GIO_IN. In a similar manner, the third and the fourth test data I/O units DQ2 and DQ3 are particularized with particular associated lines of the global input lines GIO_IN.

Further, for another particularization, the first line BUS0 of the global input lines GIO_IN is connected to a first line (TL0<0>) of a first global/bank connection lines TL0 so that a data is transferred only through the first line TL0<0>. All the lines of the global/bank connection lines TL are connected in the same manner.

As a result, data output from the first to fourth test data I/O units DQ0 to DQ3 are transferred to the quarter banks Q0 to Q3 only through particular transfer lines. For instance, data input via the fourth test data I/O unit DQ3 (input by 4 bits during 4 clocks, herein, a first 4-bit data transfer is exemplified) is loaded on the global input lines BUS3, BUS7, BUS11, and BUS15. Then, the data is transferred to the global/bank connection lines TL0<3>, TL1<3>, TL2<3>, and TL3<3>, which are directly connected to the global input lines BUS3, BUS7, BUS11, and BUS15 respectively to be stored in the temporary data storing units.

Thereafter, the data is written into the first quarter bank Q0 in response to a write signal DSTBP0. Thereafter, a 4-bit data input on a second clock is transferred to the second quarter bank Q1 in a similar manner. Likewise, each data input on third and a fourth clocks is transferred to the third and the fourth quarter banks Q2 and Q3 respectively.

Further, as a method of the particularization, it is controlled that data is written to a particular address according to a sequence of a data input through the first to fourth test data I/O units DQ0 to DQ3 and the same address is designated for a read operation. Such designation of a particular address is performed by decoding test data at the first to fourth test data I/O units DQ0 to DQ3.

The above-mentioned operation is to input data according to a write operation. Thereafter, by reading the data according to a read operation, it can be determined whether there is a defect of a memory cell.

The read operation is similar to the write operation. An operation for the first quarter bank Q0 is described below.

A 16-bit data is outputted all together from the first quarter bank Q0 to be stored in the data temporary storing unit in 4 bit pieces. Thereafter, through the above mentioned particularized lines (GIO_IN, GIO_OUT, TL), the data is transferred to the first to fourth test data I/O units DQ0 to DQ3 to be output externally.

When a data defect is detected by monitoring the output data, it can be determined from which matrix (MT0 to MT15) the defective data has been output.

Thereafter, if it is clear that there is a defect at the determined matrix, the defective memory cell may be replaced with a redundancy memory cell. Herein, a compress test is used for a memory cell test. In accordance with the present invention, since data is transferred only between a particular test data input/output unit and a particular matrix to be read or written, the polarity of the data can be different at each test data input/output unit.

While the present invention has been described with respect to the specific embodiments, it will be apparent to those skilled in the art that various changes and modifications may be made without departing from the spirit and scope of the invention as defined in the following claims.

What is claimed is:

1. A multi-port memory device, comprising:
   a bank having a plurality of matrices;
   a plurality of test data input/output (I/O) units which input/output data in a test mode, and not in a normal mode, for detecting a defective memory cell;
   a plurality of ports converted into a decoding device for decoding a command/address at the test mode, and to input/output commands, addresses and data at a normal mode;
   a plurality of data transfer lines for transferring data between the matrix and the test data I/O units, wherein the data transfer lines are grouped into the number of matrices; and
   a plurality of temporary storing units included between the data transfer lines and the matrices for temporarily storing data.

2. The multi-port memory device as recited in claim 1, further comprising a bank control unit for controlling the bank.

3. The multi-port memory device as recited in claim 2, wherein the data transfer lines include:
   global input/output lines included between the test data I/O units and the bank control unit for transferring data; and
   global/bank connection lines included between the global input/output lines and the matrices for transferring the data.

4. The multi-port memory device as recited in claim 3, wherein each of the global input lines and the global output lines includes 16 lines.

5. The multi-port memory device as recited in claim 4, wherein the global/bank connection lines include:
   first global/bank connection lines respectively connected to the global input lines; and
   second global/bank connection lines respectively connected to the global output lines.

6. The multi-port memory device as recited in claim 5, wherein the number of the temporary storing units corresponds to the number of matrices.

7. The multi-port memory device as recited in claim 6, wherein the global/bank connection lines are in groups of 4 lines, each group connected to a respective temporary storing unit.

8. The multi-port memory device as recited in claim 5, wherein the temporary storing unit includes:
   a write data temporary storing unit for temporarily storing write data for a write operation of the test mode; and
   a read data temporary storing unit for temporarily storing read data for a read operation of the test mode.

* * * * *